United States Patent
Qian (10) Patent No.: US 11,867,745 B2
(45) Date of Patent: Jan. 9, 2024

(54) PARASITIC CAPACITANCE DETECTION METHOD, MEMORY AND READABLE STORAGE MEDIUM

(71) Applicant: CHANGXIN MEMORY TECHNOLOGIES, INC., Hefei (CN)

(72) Inventor: Shibing Qian, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 234 days.

(21) Appl. No.: 17/455,969

(22) Filed: Nov. 22, 2021

(65) Prior Publication Data
US 2022/0120806 A1 Apr. 21, 2022

Related U.S. Application Data

(63) Continuation of application No. PCT/CN2021/106511, filed on Jul. 15, 2021.

(30) Foreign Application Priority Data

Oct. 16, 2020 (CN) .......................... 202011108280.X (51) Int. Cl.
*G01R 31/26* (2020.01)
*G01R 27/26* (2006.01)
*H10B 12/00* (2023.01)

(52) U.S. Cl.
CPC ...... *G01R 31/2601* (2013.01); *G01R 27/2605* (2013.01); *H10B 12/00* (2023.02)

(58) Field of Classification Search
CPC ............ G01R 31/2601; G01R 27/2605; H10B 12/00; H10B 12/05; G11C 5/063; G11C 29/025; G11C 29/50
See application file for complete search history.

(56) References Cited

U.S. PATENT DOCUMENTS

| 6,906,548 B1 * | 6/2005 | Toshiyuki .......... G01R 31/2621 324/762.02 |
| 2003/0122123 A1 | 7/2003 | Deng et al. |

(Continued)

FOREIGN PATENT DOCUMENTS

| CN | H06195426 A | 7/1994 |
| CN | 101770965 A | 7/2010 |

(Continued)

OTHER PUBLICATIONS

International Search Report as cited in PCT Application No. PCT/CN2021/106511 dated Oct. 12, 2021, 4 pages.

(Continued)

*Primary Examiner* — Jermele M Hollington
*Assistant Examiner* — Zannatul Ferdous
(74) *Attorney, Agent, or Firm* — Cooper Legal Group, LLC (57) ABSTRACT

Provided are a parasitic capacitance detection method, a memory, and a readable storage medium, relating to the field of semiconductor technologies. The detection method comprises: providing a plurality of semiconductor devices for testing, all the semiconductor devices being the same in a number of sources, a number of drains, a number of active layers, a number of gates, a number of wires and a cross-sectional area of the wire, all the semiconductor devices being different in a length of the wire therein; determining a capacitance between the wire per unit length and the gate in the semiconductor device, the capacitance between the wire per unit length and the gate being considered as a parasitic capacitance per unit length; determining a corresponding wire length of a to-be-detected semiconductor device; and determining a parasitic capacitance of the to-be-detected semiconductor device.

10 Claims, 3 Drawing Sheets

(56) References Cited

U.S. PATENT DOCUMENTS

| | | | |
|---|---|---|---|
| 2004/0227191 A1 | 11/2004 | Honda | |
| 2009/0101898 A1 | 4/2009 | Kwon | |
| 2015/0116261 A1* | 4/2015 | Ahn | G06F 3/0443 345/174 |
| 2017/0033111 A1* | 2/2017 | Yamazaki | H01L 29/7869 |
| 2017/0242065 A1 | 8/2017 | Guo et al. | |

FOREIGN PATENT DOCUMENTS

| | | |
|---|---|---|
| CN | 103575998 A | 2/2014 |
| CN | 104156526 A | 11/2014 |
| CN | 104808126 A | 7/2015 |
| CN | 105223420 A | 1/2016 |
| CN | 205749689 U | 11/2016 |
| CN | 107290594 A | 10/2017 |
| CN | 109637944 A | 4/2019 |

OTHER PUBLICATIONS

International Search Report as cited in PCT Application No. PCT/CN2021/106550 dated Oct. 12, 2021, 9 pages.

* cited by examiner

PARASITIC CAPACITANCE DETECTION METHOD, MEMORY AND READABLE STORAGE MEDIUM

CROSS-REFERENCE TO RELATED APPLICATIONS

This application is a continuation application of International Patent Application No. PCT/CN2021/106511, filed on Jul. 15, 2021, which claims priority to Chinese Patent Application No. 202011108280.X, filed with the Chinese Patent Office on Oct. 16, 2020 and entitled "PARASITIC CAPACITANCE DETECTION METHOD, MEMORY AND READABLE STORAGE MEDIUM". International Patent Application No. PCT/CN2021/106511 and Chinese Patent Application No. 202011108280.X are incorporated herein by reference in their entireties.

TECHNICAL FIELD

The present disclosure relates to the field of semiconductor technologies, and in particular to a parasitic capacitance detection method, a memory and a readable storage medium.

BACKGROUND

A semiconductor device is installed in a DRAM (Dynamic Random Access Memory). Parasitic capacitance is generated between a gate of the semiconductor device and a wire connected between a source and a drain. As the semiconductor manufacturing process shrinks, when more semiconductors can be accommodated on a chip of the same size, the parasitic capacitance effect begins to dominate a switching speed of logic gates, which affects a speed of semiconductor digital circuits on the one hand, and causes power consumption in semiconductor digital circuits on the other hand.

In order to reduce the influence of the parasitic capacitance effect, the size of the parasitic capacitance needs to be determined first. In a related art, a value of the parasitic capacitance is obtained by estimation. Because the estimation method is less accurate and when the parasitic capacitance is optimized on the basis of the estimated value of the parasitic capacitance, a good optimization effect cannot be obtained.

It is to be noted that the above information disclosed in this Background section is only for enhancement of understanding of the background of the present disclosure and therefore it may contain information that does not form the related art that is already known to a person of ordinary skill in the art.

SUMMARY

The objective of the present disclosure is to provide a parasitic capacitance detection method, a memory, and a readable storage medium.

Other features and advantages of the present disclosure will become apparent through the following detailed description, or partly learned through the practice of the present disclosure.

According to an aspect of the present disclosure, there is provided a method for detecting a parasitic capacitance in a semiconductor device, the semiconductor device being provided with sources, drains, active layers, gates located on the active layers, and wires connected to the sources and the drains, the detection method including: providing a plurality of semiconductor devices for testing, all the semiconductor devices being the same in a number of sources, a number of drains, a number of active layers, a number of gates, a number of wires and a cross-sectional area of the wire, all the semiconductor devices being different in a length of the wire therein; obtaining a total capacitance value of each of the plurality of semiconductor devices and the length of the wire in the each semiconductor device;

determining a capacitance between the wire per unit length and the gate in the semiconductor device according to the plurality of total capacitance values and the lengths of the plurality of the wire of the plurality of semiconductor devices, the capacitance between the wire per unit length and the gate being considered as a parasitic capacitance per unit length; determining a corresponding wire length of a to-be-detected semiconductor device; and determining a parasitic capacitance of the to-be-detected semiconductor device according to the parasitic capacitance per unit length and the corresponding wire length of the to-be-detected semiconductor device.

According to another aspect of the present disclosure, there is provided a dynamic random access memory, provided with a semiconductor device, a parasitic capacitance of the semiconductor device being detected by the detection method described in the above embodiments.

According to yet another aspect of the present disclosure, there is provided a computer-readable medium having a computer program stored thereon, the program implementing the detection method according to the first aspect as described in the above embodiments when executed by a processor.

It should be understood that the above general description and the following detailed description are only exemplary and explanatory and cannot limit the present disclosure.

BRIEF DESCRIPTION OF DRAWINGS

The drawings here are incorporated into the description and constitute a part of the description. The drawings show embodiments that conform to the present disclosure, and are used together with the description to explain the principle of the present disclosure. Obviously, the drawings used in the following description are merely some embodiments of the present disclosure. For those skilled in the art, other drawings may also be obtained according to these drawings without any creative work.

DESCRIPTION OF EMBODIMENTS

The exemplary embodiments will now be described more fully with reference to the accompanying drawings. However, the exemplary embodiments may be implemented in many forms and should not be construed as being limited to the examples set forth herein; on the contrary, these embodiments are provided so that the present disclosure become more comprehensive and complete and the concepts of the exemplary embodiments are fully conveyed to those skilled in the art. The described features, structures or characteristics can be combined in one or more embodiments in any suitable way.

In addition, the drawings are only schematic illustrations of the present disclosure, and are not necessarily drawn to scale. The same reference numerals in the drawings denote the same or similar parts, and a repetitive description thereof will be omitted. Some of the block diagrams shown in the drawings indicate functional entities which do not necessarily correspond to physically or logically independent entities. These functional entities may be implemented in the form of software, or in one or more hardware modules or integrated circuits, or in different networks and/or processor devices and/or microcontroller devices.

The flowchart shown in the drawings is only an exemplary description, and does not necessarily include all contents and steps, nor does it have to be executed in the described order. For example, some steps can be decomposed, and some steps can be combined or partially combined, so the actual execution order may be changed according to actual conditions. The terms such as "one", "a", "the" and the like are intended to mean that there exists one or more elements/constituent parts/etc. The terms "including" and "having" are intended to be inclusive and mean that there may be additional elements/constituent parts/etc. other than the listed elements/constituent parts/etc.

Figure 1:
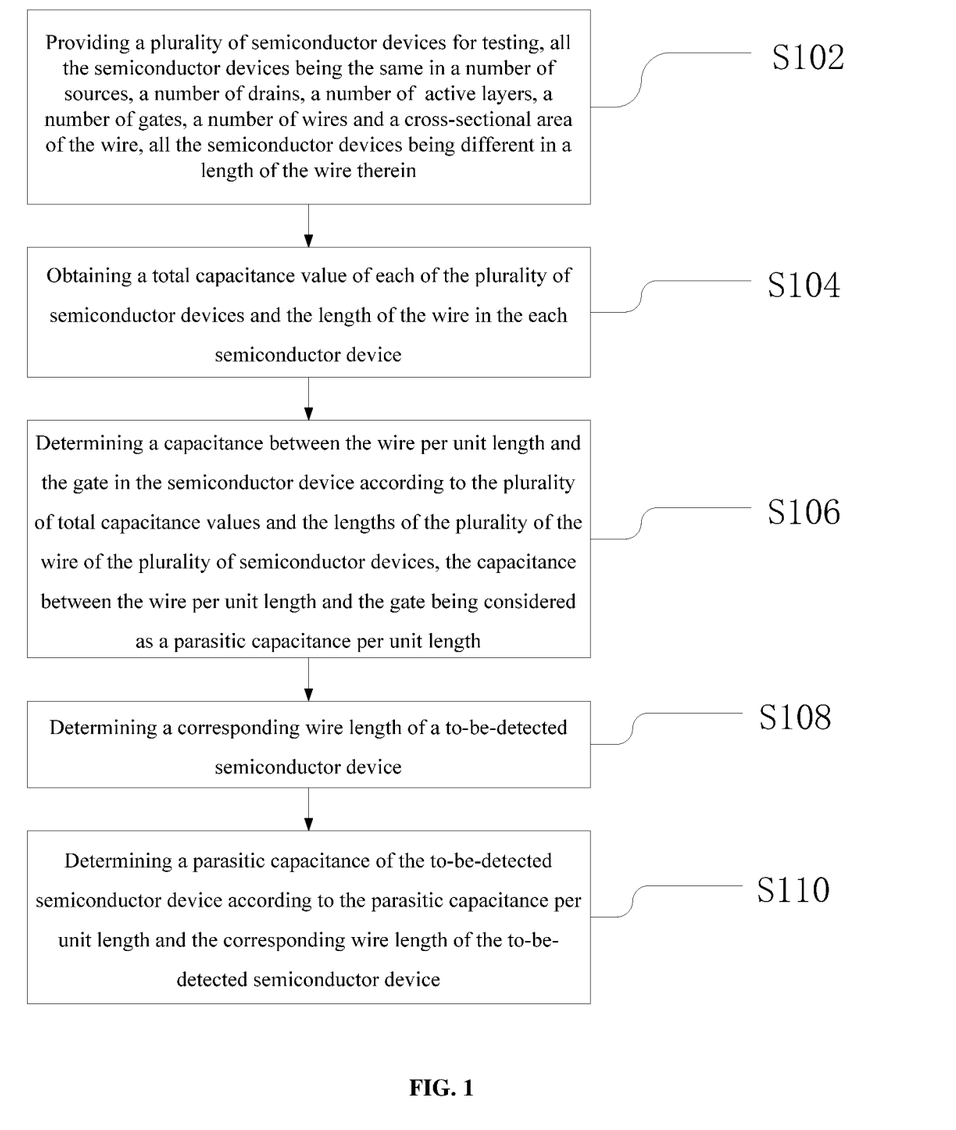
FIG. 1 is a flowchart of a manufacturing method according to an embodiment of the present disclosure.

Referring to FIG. 1, an embodiment of the present disclosure first provides a method for detecting a parasitic capacitance in a semiconductor device. The semiconductor device is provided with sources, drains, active layers, gates located on the active layers, and wires connected to the sources and the drains. The detection method includes the following steps.

In step S102, a plurality of semiconductor devices for testing are provided. All the semiconductor devices are the same in a number of sources, a number of drains, a number of active layers, a number of gates, a number of wires and a cross-sectional area of the wire, and all the semiconductor devices are different in a length of the wire therein.

Figure 2:
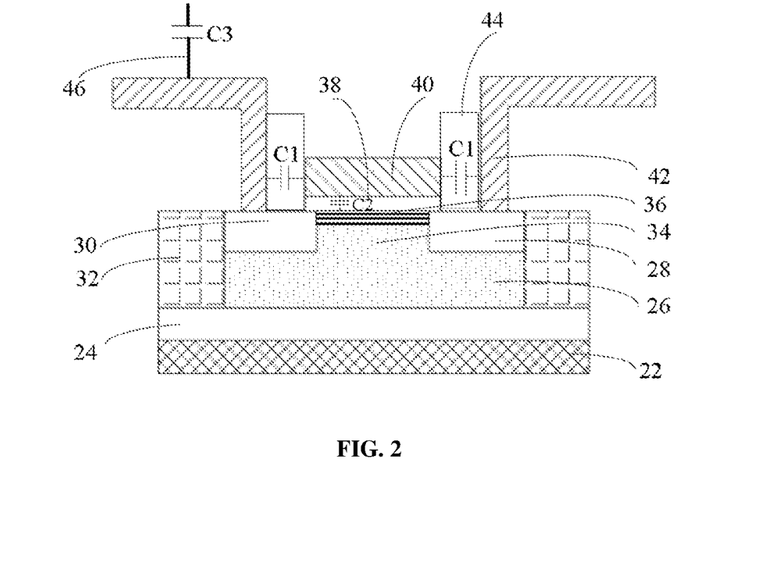
FIG. 2 is a schematic cross-sectional diagram of a semiconductor device according to an embodiment of the present disclosure.

The semiconductor device here can be configured as an MOS transistor (Metal-Oxide-Semiconductor Field-Effect Transistor). Referring to FIG. 2, an N-type MOS transistor is illustrated as an example. The MOS transistor includes a P-type doped substrate 22, a DNW (deep-Nwell) 24, a P-well 26, an active layer 34, a source 28 and a drain 30 which are located on two sides of the active layer 34, STI (Shallow Trench Isolation) structures 32 located on two sides of the P-well 26, an insulating layer 38 located on a side of active layer 34 away from the DNW 24, a gate 40 located on a side of the insulating layer 38 away from the active layer 34, and wires 42 located on two sides of the insulating layer 38 and respectively connected to the source 28 and the drain 30, and a medium layer 44 is arranged between the gate 40 and the wire 42. When a voltage greater than a threshold voltage is applied to the gate 40 and a voltage sufficient to form an electron channel is applied to the drain 30, an electron channel 36 that can connect the source 28 and the drain 30 is formed between the insulating layer 38 and the active layer 34. In this way, a parasitic capacitance C1 is generated between the gate 40 and the wire 42, a first capacitance C2 is formed between the electronic channel 36 and the gate 40, and a second capacitance C3 is formed between an external capacitance tester and a metal wire 46 connected to the wire 42. C1, C2 and C3 constitute a total capacitance of the MOS transistor.

All the semiconductor devices are the same in a width of the gate 40, a length of the active layer (channel) 34, a width of the active layer 34, and the number of wires 42.

Figure 3:
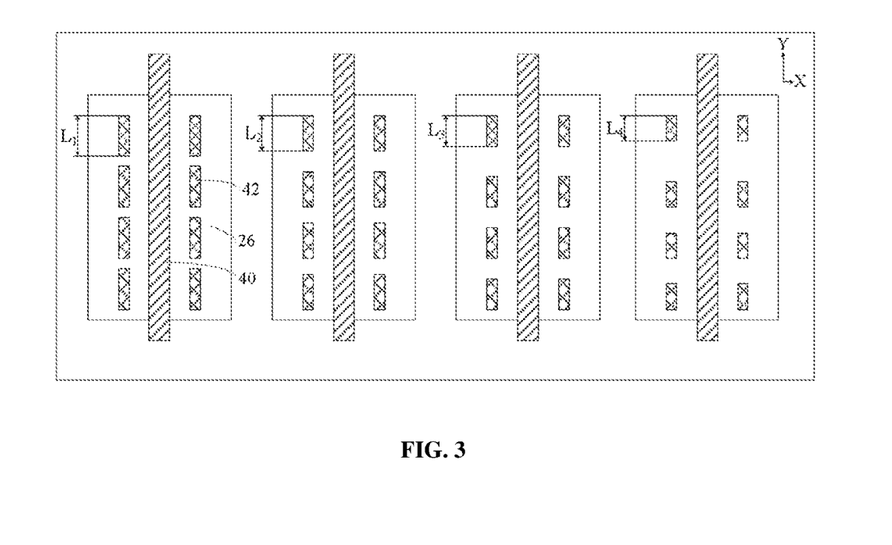
FIG. 3 is a schematic diagram of a plurality of semiconductor devices according to an embodiment of the present disclosure.

Referring to FIG. 3, the width of the active layer 34 is in a direction indicated by a Y axis, and the length of the active layer 34 is in a direction indicated by an X axis. The width of the gate 40 is in a direction indicated by the Y axis (i.e., an extending direction of the gate), and a length of the gate 40 is in a direction indicated by the X axis. The gate 40 is located on the active layer 34, and an orthographic projection of the gate 40 on the active layer 34 covers the active layer 34. Different semiconductor devices are different in the length of the wire, that is, L1, L2, L3 and L4 are all different. By connecting different semiconductor devices with wires of different lengths, the influence of the wire length on the parasitic capacitance can be determined.

In step S104, a total capacitance value of each of the plurality of semiconductor devices and the length of the wire in the each semiconductor device are obtained.

In an exemplary embodiment of the present disclosure, in addition to the number of sources, the number of drains, the number of active layers, the number of gates, the number of wires, and the cross-sectional area of the wire in each semiconductor device defined above, the semiconductor device and the to-be-detected semiconductor device are the same in the number of sources, the number of drains, the number of active layers, the number of gates, the number of wires, and the cross-sectional area of the wire.

That is, in different semiconductor devices and the to-be-detected semiconductor device, all capacitances other than the parasitic capacitance are of the same value, and the total capacitance value of each semiconductor device includes the value of the parasitic capacitance mentioned above, so the performance of the parasitic capacitance can be determined by determining a difference in total capacitance value between different semiconductor devices and a difference between the wire lengths.

Specifically, the total capacitance of the semiconductor device can be measured with the capacitance tester, and the wire length can be measured with a size measuring device.

In step S106, a capacitance between the wire per unit length and the gate in the semiconductor device is determined according to the plurality of total capacitance values and the lengths of the plurality of the wire of the plurality of semiconductor devices; the capacitance between the wire per unit length and the gate is considered as a parasitic capacitance per unit length.

Figure 4:
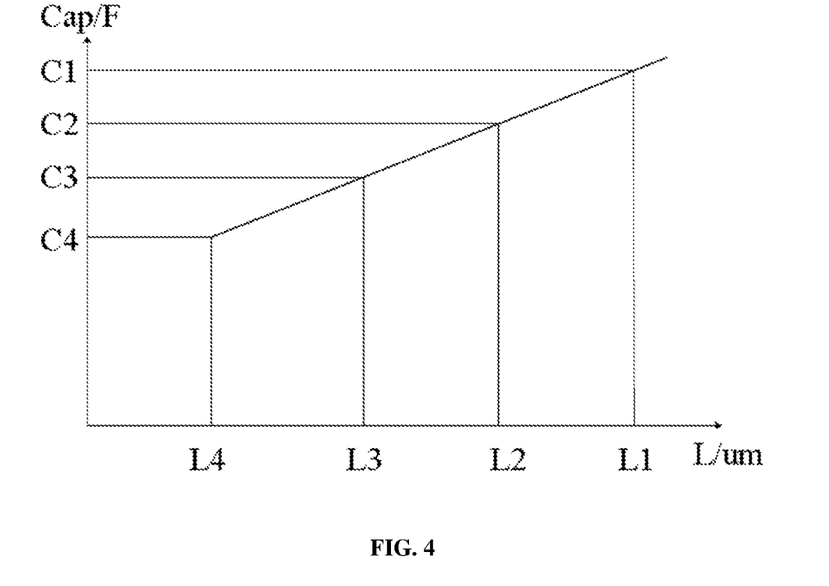
FIG. 4 is a diagram showing a relationship between a total capacitance of a semiconductor device and wire length according to an embodiment of the present disclosure.

As shown in FIG. 4, the Y axis in FIG. 4 represents the total capacitance value, and the X axis represents the wire length. Based on the total capacitance values and wire lengths of different semiconductor devices, a plurality of coordinate points are obtained. The plurality of coordinate points form an oblique line in FIG. 4 to determine the parasitic capacitance per unit length according to the slope of the oblique line.

In step S108, a corresponding wire length of a to-be-detected semiconductor device is determined.

In step S110, a parasitic capacitance of the to-be-detected semiconductor device is determined according to the parasitic capacitance per unit length and the corresponding wire length of the to-be-detected semiconductor device.

In this embodiment, wires of different lengths are connected to sources and drains of semiconductor devices of the same type to construct a plurality of semiconductor devices with different parasitic capacitances; based on the measured total capacitance and wire length of each semiconductor device, the parasitic capacitance per unit length can be further obtained; and based on the parasitic capacitance per unit length and the wire length of the to-be-detected semiconductor device, the parasitic capacitance of the to-be-detected semiconductor device is obtained. The value of the parasitic capacitance obtained by the detection method has a high detection accuracy. According to the parasitic capacitance, an optimization strategy of the parasitic capacitance in the semiconductor device can be accurately determined, and the parasitic capacitance performance can be optimized based on the optimization strategy.

In an exemplary embodiment of the present disclosure, an even number of the wires are provided and evenly arranged on two sides of the gate.

In an exemplary embodiment of the present disclosure, the plurality of wires located on the same side of the gate are connected in parallel, and connected to a capacitance tester through a metal wire.

As shown in FIGS. 2 and 3, an even number of the wires 42 are connected to the source 28 and the drain 30 on two sides of the gate. The wires 42 are respectively arranged into two columns and four rows, that is, the wires 42 are evenly distributed on the two sides of the gate 40; in this way, it can be ensured that the parasitic capacitances between the wires on the left side of the grate and the gate and the parasitic capacitances between the wires on the right side of the grate and the gate are the same, which is convenient for measurement. The wires 42 on the two sides of the gate 40 are respectively connected in parallel to the same wire, that is, the four wires 42 on the left side of the gate 40 are connected in parallel to the same wire so as to be connected with the capacitance tester through the same wire, thus realizing the detection of the total capacitance of the semiconductor device.

In addition, those skilled in the art can understand that the performance of the semiconductor device is not only influenced by the parasitic capacitance, but also by parasitic resistance, and a higher contact resistance will also cause a greater parasitic resistance. The total resistance of eight wires connected in parallel can be understood as the contact resistance of the semiconductor device, which can reduce the value of the contact resistance and can further determine the resistance value of a channel resistor of the semiconductor device more accurately.

In an exemplary embodiment of the present disclosure, the total capacitance includes a first capacitance, a second capacitance and the parasitic capacitance, wherein the first capacitance refers to a capacitance between an electron channel formed in the active layer and the gate, and the second capacitance refers to a capacitance between the metal wire and the capacitance tester.

Specifically, during the test, a voltage greater than a threshold voltage is applied to the gate, a voltage sufficient to form an electron channel is applied to the drain, and the capacitance is measured.

In addition, different semiconductor devices are the same in a distance between the electron channel and the gate and in the voltages applied to the gate and the drain, thus ensuring that the values of the first capacitances are the same.

In an exemplary embodiment of the present disclosure, the plurality of semiconductor devices are formed on the same wafer.

Referring to FIG. 3, four semiconductor devices are formed on the same wafer and can be located in the same set region of the same wafer, so that the plurality of semiconductor devices can be close in the first capacitance, the second capacitance and other parameters, thereby improving the accuracy of parasitic capacitance detection of the semiconductor devices.

In an exemplary embodiment of the present disclosure, step S106 for determining the determining the capacitance between the wire per unit length and the gate in the semiconductor device according to the plurality of total capacitance values and the lengths of the plurality of the wire of the plurality of semiconductor devices includes:

the plurality of total capacitance values including a first total capacitance value of a first semiconductor device and a second total capacitance value of a second semiconductor device, the plurality of lengths of the wire including a first length of the wire in the first semiconductor device and a second length of the wire in the second semiconductor device; determining a first difference between the first total capacitance value and the second total capacitance value; determining a second difference between the first length and the second length; obtaining the number of wires in each semiconductor device, the number of wires being used to represent the number of parasitic capacitances; and determining the parasitic capacitance per unit length according to the first difference value, the second difference value and the number of wires.

In this embodiment, based on the electrical characteristics of the device, it can be ensured that other structures of the MOS device are the same, and the lengths of different wires of the MOS device can be changed to obtain different first total capacitance values and different second total capacitance values, and then the unit parasitic capacitance C (F/um) is calculated. By implementing this detection method, the value of the parasitic capacitance obtained has a higher detection accuracy.

Referring to FIG. 4, the relationship between the total capacitance and the wire length can be indicated by a straight line. Therefore, in the actual calculation process, only two different semiconductor devices can be used for measurement, and the parasitic capacitance per unit length can be obtained based on the measurement results.

In addition, those skilled in the art can understand that the more semiconductor devices with wires of different lengths are used, the higher the accuracy of the parasitic capacitance per unit length obtained.

In an exemplary embodiment of the present application, the determining a corresponding wire length of the to-be-detected semiconductor device includes:

determining process parameters of the to-be-detected semiconductor device; and configuring the corresponding wire length in the to-be-detected semiconductor device according to the process parameters.

In this embodiment, by determining the wire length in the to-be-detected semiconductor device based on the process parameters of the to-be-detected semiconductor device, the wire length can more accurately reflect the process, and the detection accuracy of parasitic capacitance can be further improved.

An embodiment of the present disclosure provides a dynamic random access memory. The dynamic random access memory is provided with a semiconductor device. The parasitic capacitance of the semiconductor device is detected by the above-mentioned detection method. According to the parasitic capacitance, an optimization strategy of the parasitic capacitance in the semiconductor device can be accurately determined and the parasitic capacitance performance can be optimized based on the optimization strategy, thus realizing the performance optimization of the dynamic random access memory.

Figure 5:
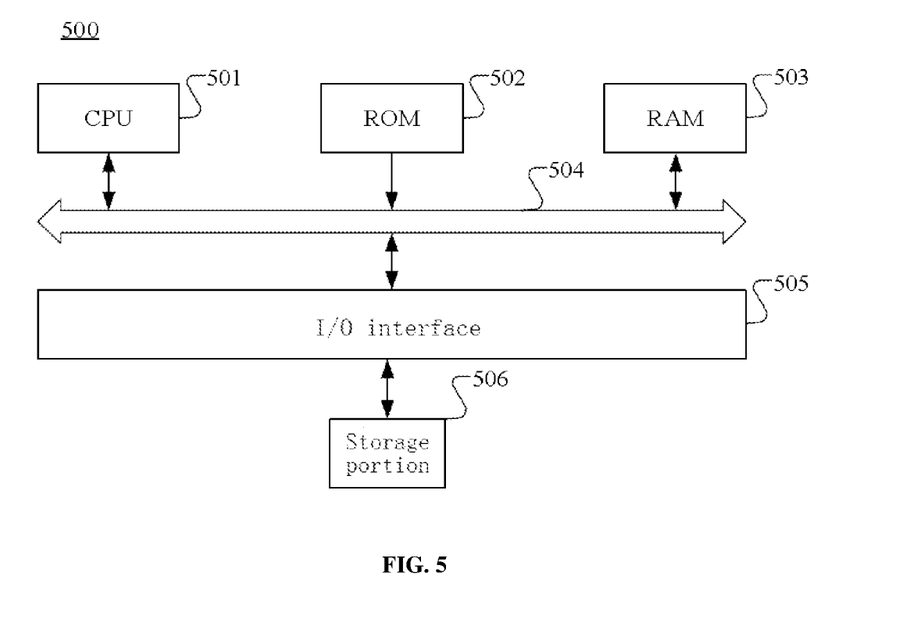
FIG. 5 is a schematic structural diagram of a computer system according to an embodiment of the present disclosure suitable for implementing an electronic device according to an embodiment of the present disclosure.

Referring now to FIG. 5, it shows a schematic structural diagram of a computer system 500 suitable for implementing an electronic device according to an embodiment of the present disclosure. The computer system 500 of the electronic device shown in FIG. 5 is only an example, and should not bring any limitation on the function and scope of use of the embodiments of the present disclosure.

As shown in FIG. 5, the computer system 500 includes a CPU (Central Processing Unit) 501, which can perform various appropriate actions and processing according to a program stored in a read-only memory (ROM) 502 or a program loaded from a storage portion 506 to a RAM (Random Access Memory) 503. In the RAM 503, various programs and data required for system operation are also stored. The CPU 501, the ROM 502, and the RAM 503 are connected to one another through a bus 504. An input/output (I/O) interface 505 is also connected to the bus 504.

In particular, according to an embodiment of the present disclosure, the process described above with reference to the flowchart can be implemented as a computer software program. For example, an embodiment of the present disclosure includes a computer program product, which includes a computer program carried on a computer-readable medium, and the computer program includes a program code for executing the method shown in the flowchart.

It should be noted that the computer-readable medium shown in the present disclosure may be a computer-readable signal medium or a computer-readable storage medium, or any combination thereof. A computer-readable storage medium may be, for example, but not limited to, an electrical, magnetic, optical, electromagnetic, infrared, or semiconductor system, apparatus, or device, or any combination thereof. A more specific example of the computer-readable storage medium may include, but is not limited to: an electrical connection having one or more wires, a portable computer disk, a hard disk, a random access memory (RAM), a read-only memory (ROM), an erasable programmable read-only memory (EPROM or flash memory), optical fiber, a portable compact disk read-only memory (CDROM), an optical storage device, a magnetic storage device, or any suitable combination of thereof. In the present disclosure, the computer-readable storage medium may be any tangible medium that contains or stores a program that may be used by or in conjunction with an instruction execution system, apparatus, or device. In the present disclosure, the computer-readable signal medium may include a data signal propagating in the baseband or as part of the carrier and carrying computer-readable program codes therein. The data signal propagating in this way may take many forms, including but not limited to an electromagnetic signal, an optical signal, or any suitable combination of thereof. The computer-readable signal medium may also be any computer-readable medium other than a computer-readable storage medium. The computer-readable medium may send, propagate, or transmit a program for use by or in conjunction with an instruction execution system, apparatus, or device. The program code contained in the computer-readable medium may be transmitted by any suitable medium, including but not limited to wireless, wire, cable, RF, or any suitable combination thereof.

The flowcharts and block diagrams in the accompanying drawings illustrate the architecture, functions, and operations of possible implementations of the system, the method, and the computer program product according to various embodiments of the present disclosure. In this regard, each of the blocks in the flowcharts or block diagrams may represent a part of a module, program segment or code; the part of the module, program segment or code include one or more executable instructions for implementing specified logic functions. It should also be noted that in some implementations as replacements, the functions marked in the blocks may also occur in an order different from that noted in the figures. For example, two consecutive blocks may actually be executed substantially in parallel, and they may sometimes be executed in the reverse sequence, depending on the functions involved. It should also be noted that each block in the block diagrams or flow charts, as well as the combinations of blocks in the block diagrams or flow charts, may be implemented with a dedicated hardware-based system that performs a specified function or operation, or may be implemented with a combination of dedicated hardware and computer instructions.

The units described in the embodiments of the present disclosure may be implemented in software or hardware, and the described units may also be provided in a processor. The names of these units do not constitute a limitation on the unit itself under certain circumstances.

As another aspect, the present disclosure also provides a computer-readable medium. The computer-readable medium may be included in the electronic device described in the above-mentioned embodiments; or it may exist alone without being assembled into the electronic device. The aforementioned computer-readable medium carries one or more programs, and when the aforementioned one or more programs are executed by an electronic device, the electronic device can implement the detection method as described in the aforementioned embodiments.

For example, the electronic device can implement the following steps as shown in FIG. 1: step S102: providing a plurality of semiconductor devices for testing, all the semiconductor devices being the same in the number of sources, the number of drains, the number of active layers, the number of gates, the number of wires and the cross-sectional area of the wire, all the semiconductor devices being different in the length of the wire therein; step S104: obtaining a total capacitance value of each of the plurality of semiconductor devices and the length of the wire in the each semiconductor device; step S106: determining a capacitance between the wire per unit length and the gate in the semiconductor device according to the plurality of total capacitance values and the lengths of the plurality of the wire of the plurality of semiconductor devices, the capacitance between the wire per unit length and the gate being considered as a parasitic capacitance per unit length; step S108: determining a corresponding wire length of a to-be-detected semiconductor device; and step S110: determining a parasitic capacitance of the to-be-detected semiconductor device according to the parasitic capacitance per unit length and the corresponding wire length of the to-be-detected semiconductor device.

It should be noted that although a plurality of modules or units of the device for action execution are mentioned in the above detailed description, this division is not mandatory. In fact, according to the embodiments of the present disclosure, the features and functions of two or more modules or units described above may be embodied in one module or unit. Conversely, the features and functions of a module or unit described above can be further divided into multiple modules or units to be embodied.

In addition, although the various steps of the method of the present disclosure are described in a specific sequence in the drawings, this does not require or imply that the steps must be performed in the specific sequence, or all the steps shown must be performed to achieve the desired results. Additionally or alternatively, certain steps may be omitted, multiple steps may be combined into one step for execution, and/or one step may be decomposed into multiple steps for execution.

Through the description of the above embodiments, those skilled in the art can easily understand that the example embodiments described here can be implemented by software, or can be implemented by combining software with necessary hardware. Therefore, the technical solution according to the embodiments of the present disclosure can be embodied in the form of a software product, the software product can be stored in a non-volatile storage medium (which can be a CDROM, U disk, mobile hard disk, or the like) or on the network and includes several instructions to enable a computing device (which can be a personal computer, a server, a mobile terminal, a network device, or the like) to execute the method according to the embodiments of the present disclosure.

Those skilled in the art will readily conceive of other implementation solutions of the present disclosure after considering this description and practicing the invention disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are pointed out by the appended claims.

What is claimed is:

1. A method for detecting a parasitic capacitance in a semiconductor device, the semiconductor device being provided with sources, drains, active layers, gates located on the active layers, and wires connected to the sources and the drains, the method for detecting the parasitic capacitance in the semiconductor device comprising:
   providing a plurality of semiconductor devices for testing, all the semiconductor devices being the same in a number of sources, a number of drains, a number of active layers, a number of gates, a number of wires and a cross-sectional area of the wire, all the semiconductor devices being different in a length of the wire therein;
   obtaining a total capacitance value of each of the plurality of semiconductor devices and the length of the wire in the each semiconductor device;
   determining a capacitance between the wire per unit length and the gate in the semiconductor device according to the plurality of total capacitance values and the lengths of the plurality of the wire of the plurality of semiconductor devices, the capacitance between the wire per unit length and the gate being considered as a parasitic capacitance per unit length;
   determining a corresponding wire length of a to-be-detected semiconductor device; and
   determining a parasitic capacitance of the to-be-detected semiconductor device according to the parasitic capacitance per unit length and the corresponding wire length of the to-be-detected semiconductor device.

2. The method for detecting the parasitic capacitance in the semiconductor device according to claim 1, wherein an even number of the wires are provided and evenly arranged on two sides of the gate.

3. The method for detecting the parasitic capacitance in the semiconductor device according to claim 2, wherein the wires located on the same side of the gate are connected in parallel, and connected to a capacitance tester through a metal wire.

4. The method for detecting the parasitic capacitance in the semiconductor device according to claim 3, wherein the total capacitance includes a first capacitance, a second capacitance and the parasitic capacitance;
   wherein the first capacitance refers to a capacitance between an electron channel formed in the active layer and the gate, and the second capacitance refers to a capacitance between the metal wire and the capacitance tester.

5. The method for detecting the parasitic capacitance in the semiconductor device according to claim 1, wherein the plurality of semiconductor devices for testing are formed on a same wafer.

6. The method for detecting the parasitic capacitance in the semiconductor device according to claim 1, wherein the semiconductor device and the to-be-detected semiconductor device are the same in the number of the source, the number of the drain, the number of the active layer, the number of the gate, the number of the wire, and the cross-sectional area of the wire.

7. The method for detecting the parasitic capacitance in the semiconductor device according to claim 1, wherein the determining the capacitance between the wire per unit length and the gate in the semiconductor device according to the plurality of total capacitance values and the lengths of the plurality of the wire of the plurality of semiconductor devices comprises:
   the plurality of total capacitance values comprising a first total capacitance value of a first semiconductor device and a second total capacitance value of a second semiconductor device, the plurality of lengths of the wire comprising a first length of the wire in the first semiconductor device and a second length of the wire in the second semiconductor device;
   determining a first difference between the first total capacitance value and the second total capacitance value;
   determining a second difference between the first length and the second length;
   obtaining the number of wires in each semiconductor device, the number of wires being used to represent the number of parasitic capacitances; and
   determining the parasitic capacitance per unit length according to the first difference value, the second difference value and the number of wires.

8. The method for detecting the parasitic capacitance in the semiconductor device according to claim 1, wherein the determining the corresponding wire length of the to-be-detected semiconductor device comprises:
   determining process parameters of the to-be-detected semiconductor device; and
   configuring the corresponding wire length in the to-be-detected semiconductor device according to the process parameters.

9. A dynamic random access memory, provided with a semiconductor device, a parasitic capacitance of the semiconductor device being detected by the method for detecting the parasitic capacitance in the semiconductor device according to claim 1.

10. A computer-readable medium, having a computer program stored thereon, the computer program implementing the method for detecting the parasitic capacitance in the semiconductor device according to claim 1 when executed by a processor.

\* \* \* \* \*